US011108386B2

(12) United States Patent
Nishida et al.

(10) Patent No.: US 11,108,386 B2
(45) Date of Patent: Aug. 31, 2021

(54) COMPARATOR CIRCUIT ARRANGEMENT AND METHOD OF FORMING THE SAME

(71) Applicant: Agency for Science, Technology and Research, Singapore (SG)

(72) Inventors: Yoshio Nishida, Singapore (SG); Ravinder Pal Singh, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 16/971,226

(22) PCT Filed: Mar. 11, 2019

(86) PCT No.: PCT/SG2019/050133
§ 371 (c)(1),
(2) Date: Aug. 19, 2020

(87) PCT Pub. No.: WO2019/182511
PCT Pub. Date: Sep. 26, 2019

(65) Prior Publication Data
US 2021/0119623 A1    Apr. 22, 2021

(30) Foreign Application Priority Data

Mar. 22, 2018    (SG) ............................ 10201802382Y

(51) Int. Cl.
*H03K 5/22*    (2006.01)
*H03K 5/24*    (2006.01)
(Continued)

(52) U.S. Cl.
CPC ............. *H03K 5/2481* (2013.01); *H03K 5/05* (2013.01); *H03K 2005/00293* (2013.01)

(58) Field of Classification Search
CPC ................... H03K 5/2481; H03K 5/05; H03K 2005/00293
(Continued)

(56) References Cited

U.S. PATENT DOCUMENTS 3,970,919 A    7/1976    Butcher
7,570,190 B1    8/2009    Pagones et al.
(Continued)

FOREIGN PATENT DOCUMENTS

CN    20290682 U    4/2013
JP    H07-104014 A    4/1995

OTHER PUBLICATIONS

Texas Instruments, "LM3224 615kHz/1.25MHz Step-up PWM DC/DC Converter," Dec. 2004—Revised Mar. 2013, pp. 1-21.
(Continued)

*Primary Examiner* — Ryan Jager
(74) *Attorney, Agent, or Firm* — Winstead PC

(57) ABSTRACT

Various embodiments may provide a comparator circuit arrangement. The comparator circuit arrangement may include a preamplifier having a first input configured to be coupled to a first input voltage, a second input configured to be coupled to a second input voltage, and an output configured to generate a preamplifier output signal based on the first input voltage and the second input voltage. The comparator circuit arrangement may also include a switch circuit arrangement coupled to the preamplifier, the switch circuit arrangement configured to deactivate the preamplifier upon the second input voltage exceeding the first input voltage and further configured to activate the preamplifier upon a fall of the second input voltage, and a pull-up circuit arrangement coupled to the output of the preamplifier, the pull-up circuit arrangement configured to provide a boost
(Continued)

voltage to the preamplifier output signal for a predetermined duration upon the fall of the second input voltage.

19 Claims, 16 Drawing Sheets

(51) Int. Cl.
*H03K 5/05* (2006.01)
*H03K 5/00* (2006.01)

(58) Field of Classification Search
USPC .......................................................... 327/65
See application file for complete search history.

(56) References Cited

U.S. PATENT DOCUMENTS

| | | | | |
|---|---|---|---|---|
| 8,890,599 | B1* | 11/2014 | Xiao | H02H 9/041 327/321 |
| 9,602,088 | B1* | 3/2017 | Fu | G05F 1/00 |
| 2008/0143697 | A1* | 6/2008 | Kojima | G09G 3/3688 345/204 |
| 2015/0187335 | A1* | 7/2015 | Sugiyama | G09G 3/2014 345/208 |
| 2017/0272678 | A1* | 9/2017 | Sakakibara | H01L 27/1461 |

OTHER PUBLICATIONS

On Semiconductor, "Low Power PWM Controller with On-Chip Power Switch and Startup Circuits for 48 V Telecom Systems," Sep. 2014, pp. 1-21.
Kim et al., "A Fully-Integrated 3-Level DC-DC Converter for Nanosecond-Scale DVFS," IEEE Journal of Solid-State Circuits, vol. 47, No. 1, Jan. 2012, pp. 206-219.
Noah Sturcken, "Integrated Power Conversion with Thin-Film Magnetic Core Inductors," APEC 2014, pp. 1-29.
Levy et al., "A CMOS Low-Power, High-Speed, Asynchronous Comparator for Synchronous Rectification Applications," IEEE International Symposium on Circuits and Systems, Geneva, Switzerland, May 28-31, 2000, pp. 541-544.
Yang et al., "A High-Precision, Low Offset Voltage, Delay Stability Comparator," Fifth International Conference on Intelligent Human-Machine Systems and Cybernetics, 2013, pp. 466-469.
Sidiropoulos et al., "An Integrated DC-AC Inverter for Electroluminescent Lamps," Conference on DCIS, 2014, pp. 1-6.
International Search Report for International Application No. PCT/SG2019/050133 dated Jun. 11, 2019, pp. 1-4.
Written Opinion of the International Searching Authority for International Application No. PCT/SG2019/050133 dated Jun. 11, 2019, pp. 1-4.

* cited by examiner

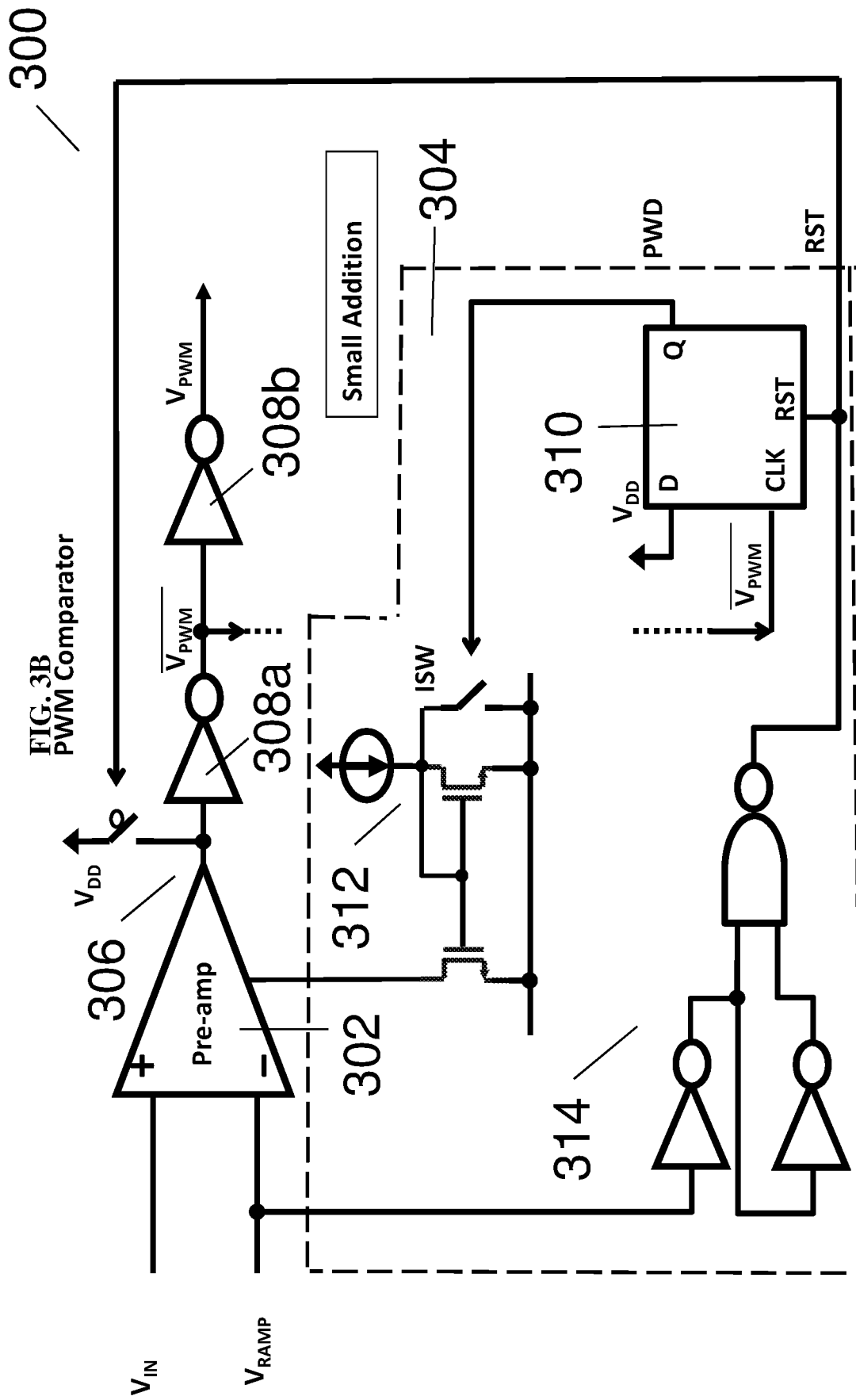

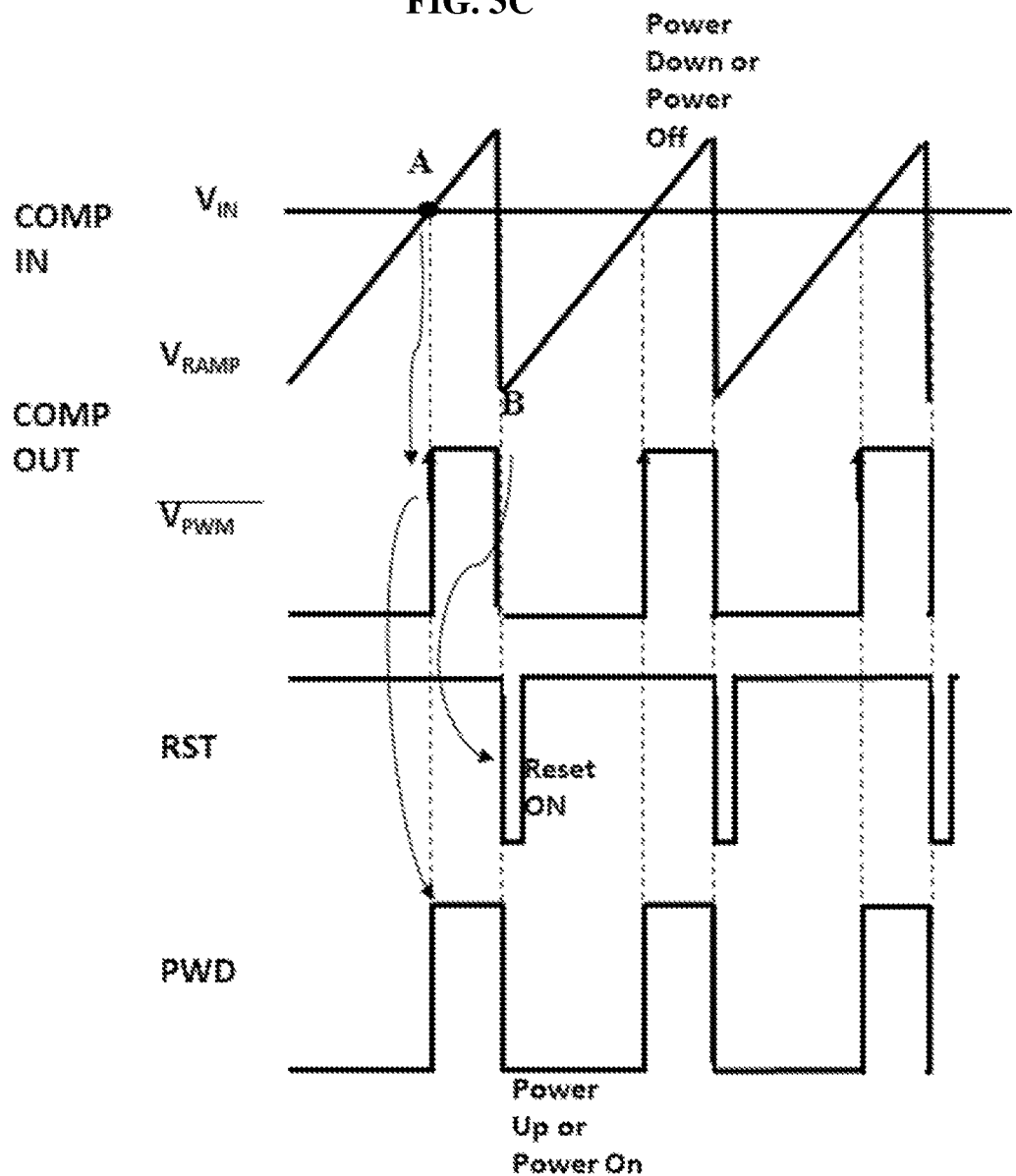

PWM Comparator

COMPARATOR CIRCUIT ARRANGEMENT AND METHOD OF FORMING THE SAME

CROSS-REFERENCE TO RELATED APPLICATION

This application claims the benefit of priority of Singapore application No. 10201802382Y filed Mar. 22, 2018, the contents of it being hereby incorporated by reference in its entirety for all purposes.

TECHNICAL FIELD

Various aspects of this disclosure relate to a comparator circuit arrangement. Various aspects of this disclosure relate to a method of forming a comparator circuit arrangement.

BACKGROUND

Pulse width modulation (PWM) is a widely used technique in power electronics devices such as voltage regulators, motor controllers, power inverters, etc. The PWM comparator plays a key role in converting analog voltage signals to pulse signals. The comparator senses the input voltage level relative to a pre-determined low or high voltage reference, and outputs the pulse signal whose width corresponds to the input voltage level. Due to the continuous-time ramp signal input to the comparator, a high input-sensitivity is required for the circuit to avoid long response time. Moreover, a recent trend toward integrated voltage regulation (IVR) requires high-speed switching of up to 200 MHz for power device systems. However, such a high-sensitivity, high-speed PWM comparator would draw quite a significant amount of operating current.

SUMMARY

Various embodiments may provide a comparator circuit arrangement. The comparator circuit arrangement may include a preamplifier having a first input configured to be coupled to a first input voltage, a second input configured to be coupled to a second input voltage, and an output configured to generate a preamplifier output signal based on the first input voltage and the second input voltage. The comparator circuit arrangement may also include a switch circuit arrangement coupled to the preamplifier, the switch circuit arrangement configured to deactivate the preamplifier upon the second input voltage exceeding the first input voltage and further configured to activate the preamplifier upon a fall of the second input voltage. The comparator circuit arrangement may further include a pull-up circuit arrangement coupled to the output of the preamplifier, the pull-up circuit arrangement configured to provide a boost voltage to the preamplifier output signal for a predetermined duration upon the fall of the second input voltage.

Various embodiments may provide a method of forming a comparator circuit arrangement. The method may include providing a preamplifier having a first input configured to be coupled to a first input voltage, a second input configured to be coupled to a second input voltage, and an output configured to generate a preamplifier output signal based on the first input voltage and the second input voltage. The method may also include coupling a switch circuit arrangement to the preamplifier, the switch circuit arrangement configured to deactivate the preamplifier upon the second input voltage exceeding the first input voltage and further configured to activate the preamplifier upon a fall of the second input voltage. The method may further include coupling a pull-up circuit arrangement to the output of the preamplifier, the pull-up circuit arrangement configured to provide a boost voltage to the preamplifier output signal for a predetermined duration upon the fall of the second input voltage.

Various embodiments may provide a method of operating a comparator circuit arrangement. The method may include coupling a first input voltage to a first input of a preamplifier. The method may also include coupling a second input voltage to a second input of the preamplifier. The preamplifier may also include an output configured to generate a preamplifier output signal based on the first input voltage and the second input voltage. The comparator circuit arrangement may further include a switch circuit arrangement coupled to the preamplifier, the switch circuit arrangement configured to deactivate the preamplifier upon the second input voltage exceeding the first input voltage and further configured to activate the preamplifier upon a fall of the second input voltage. The comparator circuit arrangement may additionally include a pull-up circuit arrangement coupled to the output of the preamplifier, the pull-up circuit arrangement configured to provide a boost voltage to the preamplifier output signal for a predetermined duration upon the fall of the second input voltage.

BRIEF DESCRIPTION OF THE DRAWINGS

The invention will be better understood with reference to the detailed description when considered in conjunction with the non-limiting examples and the accompanying drawings, in which:

FIG. 3B shows a detailed schematic of the comparator circuit arrangement according to various embodiments.

FIG. 3C shows a detailed timing diagram of various signals provided to or generated by the comparator circuit arrangement according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or circuit arrangements are analogously valid for the other methods or circuit arrangements. Similarly, embodiments described in the context of a method are analogously valid for circuit arrangement, and vice versa.

A "circuit" may be understood as any kind of a logic implementing entity, which may be special purpose circuitry or a processor executing software stored in a memory, firmware, or any combination thereof. Thus, in various embodiments, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail may also be understood as a "circuit" in accordance with various alternative embodiments. A "circuit" may carry analogue and/or digital signals.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

As highlighted above, it may therefore be desirable to reduce current consumption (and accordingly power consumption) to boost the efficiency of the power device system.

Figure 1:
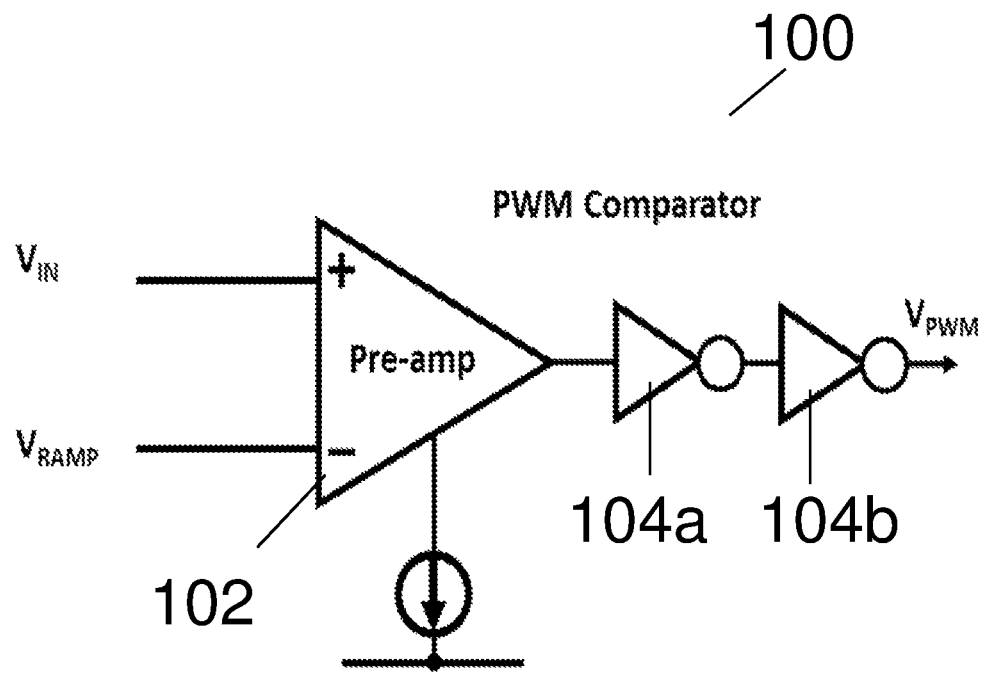
FIG. 1 shows a conventional pulse width modulation comparator as well as the timing diagram of the various signals provided to or generated by the modulation comparator.
Figure 1:
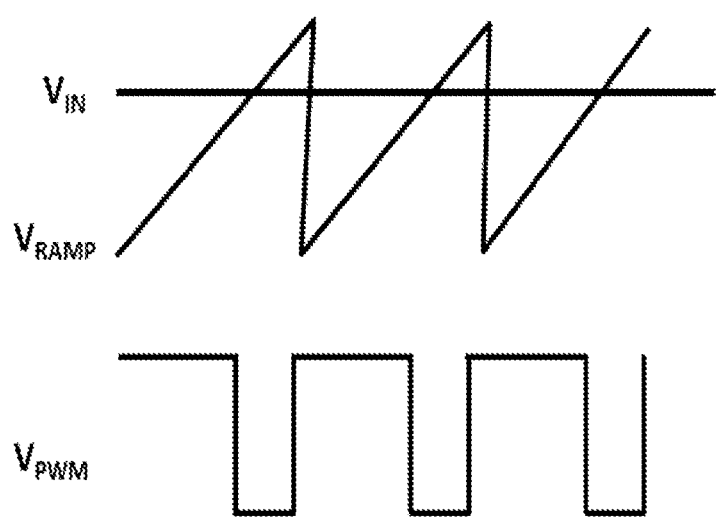

FIG. 1 shows a conventional pulse width modulation comparator 100 as well as the timing diagram of the various signals provided to or generated by the modulation comparator 100.

The comparator 100 may include a pre-amplifier (Preamp) 102 to amplify small input signal as well as logic inverters 104a and 104b to rectify the amplified signal and drive the output load. Ramp input signal $V_{RAMP}$ is a kind of reference signal which linearly increases from a low voltage $V_{low}$ to a high voltage $V_{high}$ to determine the voltage level of a relatively low frequency input voltage $V_{IN}$.

Based on the comparison between $V_{IN}$ and $V_{RAMP}$, the comparator outputs a pulse width modulation signal ($V_{PWM}$) whose duty ratio corresponds with ($V_{IN}-V_{low}$)/($V_{high}-V_{low}$). After the ramp input signal reaches the high voltage ($V_{high}$), the ramp input signal quickly drops to the low voltage ($V_{low}$) to start another input level searching process. Although there are several types of comparator circuits to achieve better performance (e.g. low offset, high-speed, low power consumption, etc.), conventional comparator circuits are typically kept active with constant drawing of the operating current regardless of the input voltage level.

Various embodiments may seek to reduce current consumption and power consumption. Various embodiments may also work under high switching frequencies. Various embodiments may be able to work at switching frequencies above 100 MHz, e.g. about 200 MHz. In comparison, conventional comparators are designed to work under a switching frequency of about 1.25 MHz. Conventional comparators may also suffer from large power consumption for speeding up without any power-saving techniques.

Various embodiments may be configured to work at higher speeds with lower power consumption compared to conventional comparators.

Figure 2:
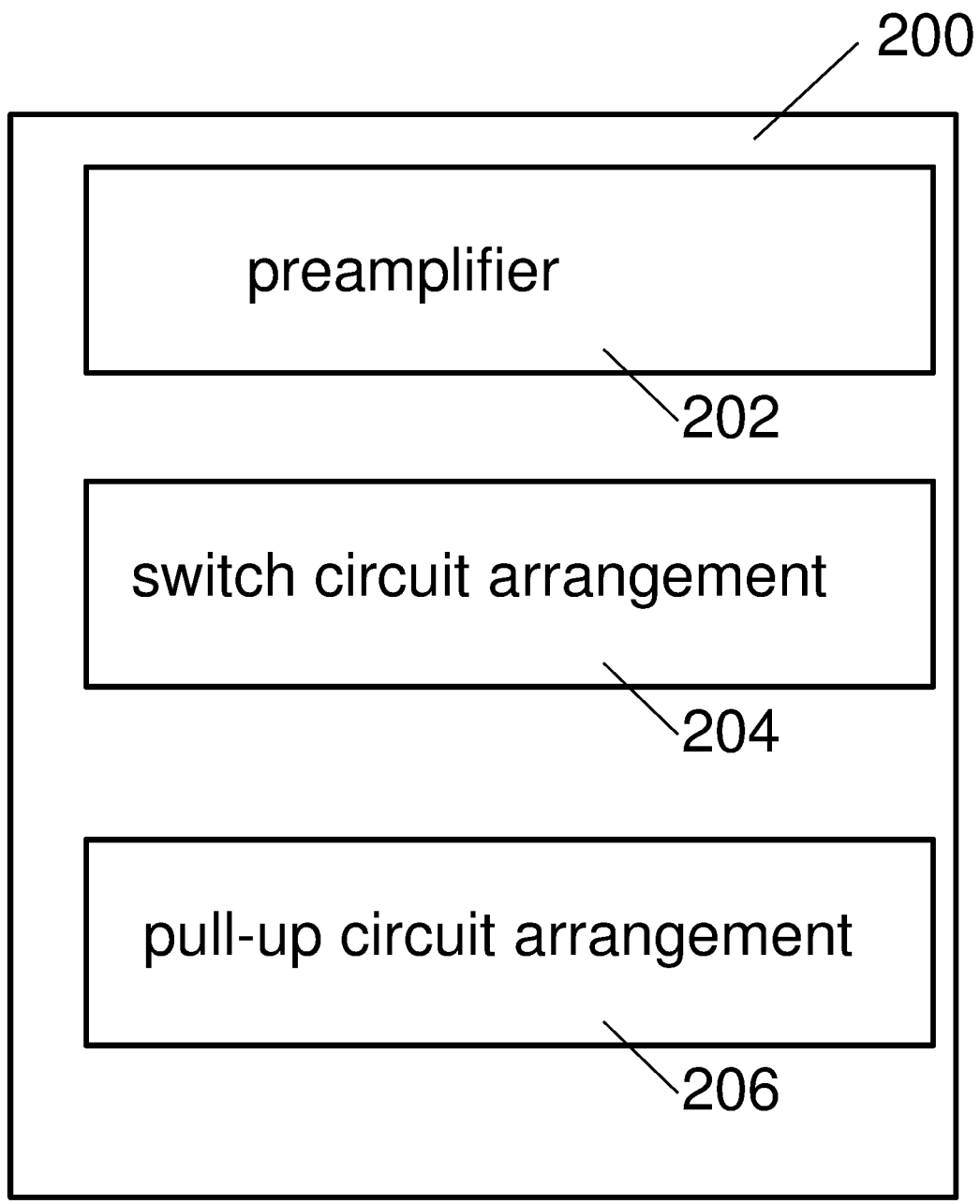
FIG. 2 is a general illustration of a comparator circuit arrangement according to various embodiments.

FIG. 2 is a general illustration of a comparator circuit arrangement 200 according to various embodiments. The comparator circuit arrangement 200 may include a preamplifier 202 having a first input configured to be coupled to a first input voltage, a second input configured to be coupled to a second input voltage, and an output configured to generate a preamplifier output signal based on the first input voltage and the second input voltage. The comparator circuit arrangement 200 may also include a switch circuit arrangement 204 coupled to the preamplifier 202, the switch circuit arrangement 204 configured to deactivate the preamplifier 202 upon the second input voltage exceeding the first input voltage and further configured to activate the preamplifier 202 upon a fall of the second input voltage. The comparator circuit arrangement 200 may further include a pull-up circuit arrangement 206 coupled to the output of the preamplifier 202, the pull-up circuit arrangement 206 configured to provide a boost voltage to the preamplifier output signal for a predetermined duration upon the fall of the second input voltage.

In other words, the comparator circuit arrangement 200 may include a pre-amplifier 202 connected to a switch circuit arrangement 204 as well as a pull-up circuit arrangement 206. The switch circuit arrangement 204 may be configured to switch off the pre-amplifier 202 at times when the second input voltage is greater than the first input voltage and switch on the pre-amplifier when the second input voltage drops. The pull-up circuit arrangement 206 may serve to boost the output signal upon the fall of the second input voltage.

For avoidance of doubt, FIG. 2 serves to illustrate features of a comparator circuit arrangement 200 according to various embodiments, and does not limit or indicate, for instance, the arrangement, the orientation or the sizes of the features.

In various embodiments, the first input voltage may have a first waveform. The second input voltage may have a second waveform including a first part that increases, e.g. linearly, from a first predetermined value below a value of the first input voltage to a second predetermined value above the value of the first input voltage within a first predetermined period of time, and a second part that decreases, e.g. linearly, from the second predetermined value to the first predetermined value within a second predetermined period of time, the second predetermined period of time being shorter than the first predetermined period of time. The second input voltage may be a ramp voltage. The first waveform may vary more slowly than the second waveform.

The second predetermined period of time may be much shorter than the first predetermined period of time. For instance, the second period of time may be less than one-tenths (1/10) of the first period of time. The first waveform may vary much more slowly than the second waveform. The first waveform may almost be of a fixed voltage. The second waveform may be a ramp waveform.

In various other embodiments, the second input voltage may have a triangle waveform. The triangle waveform may have a first part that increases, e.g. linearly, from a first predetermined value below a value of the first input voltage to a second predetermined value above the value of the first input voltage within a first predetermined period of time, and a second part that decreases, e.g. linearly, from the second predetermined value to the first predetermined value within a second predetermined period of time substantially equal to the first predetermined period of time.

In various embodiments, the comparator circuit arrangement 200 or the switch circuit arrangement 204 may include a reset circuit arrangement coupled to the second input of the preamplifier 202. The reset circuit arrangement may be configured to provide or generate a reset pulse in a reset signal upon the fall of the second input voltage.

The reset pulse in the reset signal may be generated by temporarily changing a state of the reset signal. For instance, the reset signal may normally be in a "high" state. The reset pulse may be generated by switching the reset signal to a "low" state for a short period of time, e.g. less than 1 ns or less than 0.5 ns, before switching the reset signal back to the "high" state.

In various embodiments, the reset circuit arrangement may include a NAND gate having a first input, a second input, and an output. The reset circuit arrangement may also include a first NOT gate having an input configured to receiving the second input voltage, and an output connected to the first input of the NAND gate. The reset circuit arrangement may further include a second NOT gate having an input connected to the output of the first NOT gate, and an output connected to the second input of the NAND gate.

The reset circuit arrangement may be configured so that the output of the NAND gate may be configured to generate the reset signal upon the fall of the second input voltage.

In various embodiments, the switch circuit arrangement 204 may include a D flip-flop. The output of the NAND gate may be connected to the D flip-flop, i.e. the reset (RST) input or port of the D flip-flop.

In various embodiments, the switch circuit arrangement 204 may further include a current mirror circuit arrangement coupled to the D flip-flop. The reset pulse (generated by the reset circuit arrangement) may be provided to the D flip-flop so that the D flip-flop, upon receiving the reset pulse, controls the current mirror circuit arrangement to activate the preamplifier.

In various embodiments, the D flip-flop may include an input or port (D) configured to be coupled to a fixed reference voltage source. The fixed reference voltage source may provide a voltage $V_{DD}$, which may correspond to a digital logic "high".

In the current context, a "high" state may refer to a logical "1" state, and a "low" state may refer to a logical "0" state.

In various embodiments, the D flip-flop may further include a clock input or port (CLK) configured to be coupled to a variable signal based on the second input voltage and the first input voltage received by the preamplifier 202. The variable signal may be complementary or inverted ($\overline{V_{PWM}}$) to an output of the comparator circuit arrangement ($V_{PWM}$).

The output of the comparator circuit arrangement ($V_{PWM}$) may be generated based on the output of the preamplifier 202 and the boost voltage.

In various embodiments, the D flip-flop may also include a reset input or port (RST) configured to receive the reset signal so that the reset pulse resets the D flip-flop, i.e. upon the fall of the second input voltage. The D flip-flip may also include an output (Q) configured to generate a power down (PWD) signal based on the fixed voltage, the variable signal, and the reset signal.

The power down signal may be at a first state (may be referred to as "power off" state or "power down" state) upon the second input voltage exceeding the first input voltage. The power down signal may be at a second state (may be referred to as "power on" state or "power up" state) upon the fall of the second input voltage.

In various embodiments, the switch circuit arrangement 204 may further include a current mirror circuit arrangement coupled to the D flip-flop.

The current mirror circuit arrangement may be connected to the preamplifier 202, e.g. the power input of the preamplifier 202. The preamplifier 202 may be configured to be deactivated when the power down signal is at the first state ("power off" state or "power down" state). Conversely, the preamplifier 202 may be configured to be activated when the power down signal is at the second state ("power on" state or "power up" state).

The current mirror circuit arrangement may include a current mirror and a current mirror switch. The current mirror switch may be configured to receive the power down signal. The current mirror switch may be configured to control the current mirror, i.e. configured to activate or deactivate the current mirror, based on a state of the power down signal. The current mirror switch may be configured to deactivate the current mirror when the power down signal is at the first state ("power off" state or "power down" state), thereby deactivating the preamplifier 202. The current mirror switch may be further configured to activate the current mirror when the power down signal is at the second state ("power on" state or "power up" state), thereby activating the preamplifier 202.

In the current context, "activate" may mean to turn or switch on, while "deactivate" may mean to turn or switch off.

In various embodiments, the pull-up circuit arrangement 206 may be configured to receive the reset signal and may be further configured to provide the boost voltage to the preamplifier output signal (for the predetermined duration) upon receiving the reset pulse.

In various embodiments, the pull-up circuit arrangement 206 may include a fixed boost voltage source configured to provide the boost voltage. The boost voltage may be the voltage $V_{DD}$. In various embodiments, the boost voltage may be or may not be equal to the voltage provided by the fixed reference voltage source to the D flip-flop.

In various embodiments, the pull-up circuit arrangement 206 may include a pull-up switch. The pull-up switch may be configured to connect the output of the preamplifier 202 to the fixed boost voltage source upon receiving the reset pulse, thereby provide the boost voltage to the preamplifier output signal for the predetermined duration.

In various embodiments, the comparator circuit arrangement 200 may include a first inverter having an input connected to the output of the preamplifier, and an output. The comparator circuit arrangement 200 may also include a second inverter having an input connected to the output of the first inverter, and an output configured to generate the output of the comparator circuit arrangement ($V_{PWM}$). The output of the first inverter may be configured to generate the variable signal that may be complementary or inverted ($\overline{V_{PWM}}$) to the output of the comparator circuit arrangement ($V_{PWM}$).

Figure 3A:
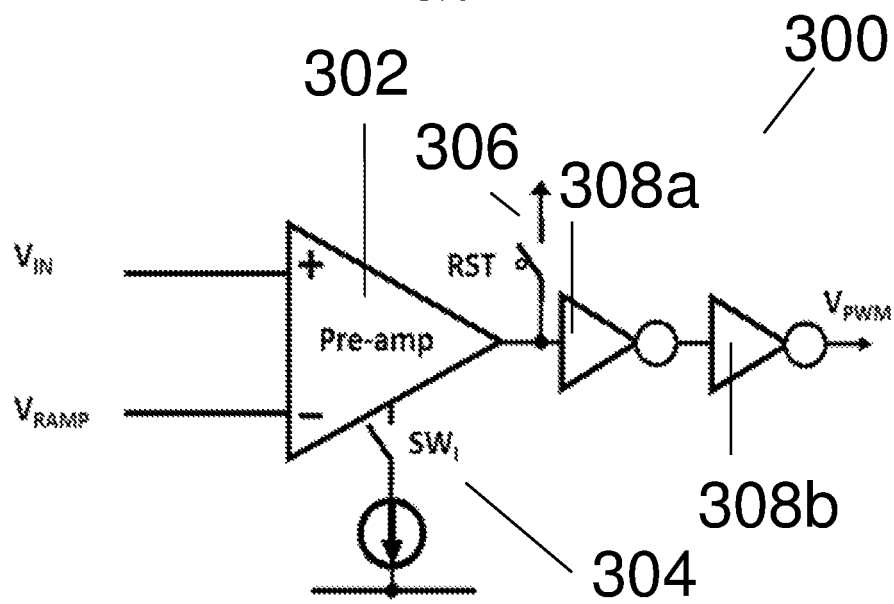
FIG. 3A shows a schematic of a comparator circuit arrangement according to various embodiments as well as the timing diagram of the various signals provided to or generated by the comparator circuit arrangement.
Figure 3A:
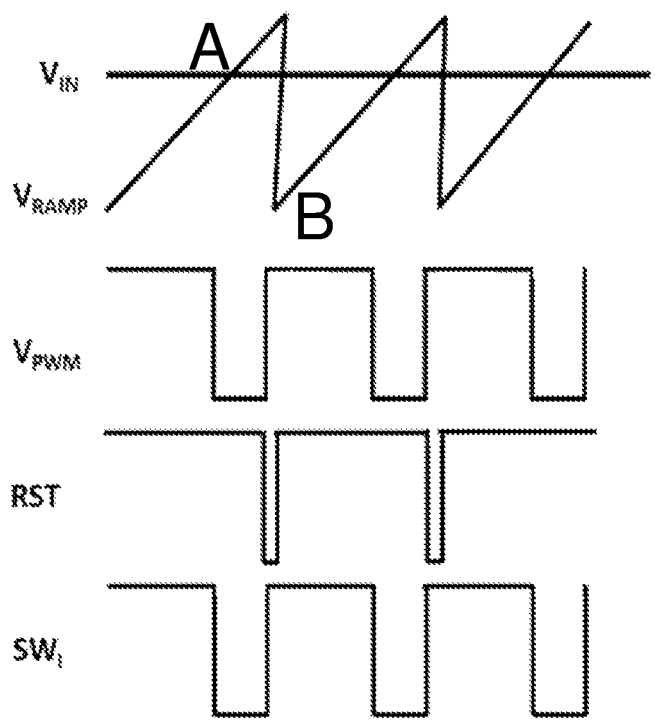

FIG. 3A shows a schematic of a comparator circuit arrangement 300 according to various embodiments as well as the timing diagram of the various signals provided to or generated by the comparator circuit arrangement 300.

The comparator circuit arrangement 300 may include a preamplifier 302 having a first input (e.g. positive input) configured to be coupled to a first input voltage ($V_{IN}$), a second input (e.g. negative input) configured to be coupled to a second input voltage, i.e. a ramp voltage ($V_{RAMP}$), and an output configured to generate a preamplifier output signal based on the first input voltage ($V_{IN}$) and the second input voltage ($V_{RAMP}$). The comparator circuit arrangement 300 may also include a switch circuit arrangement 304 coupled to the preamplifier 302, the switch circuit arrangement 304 configured to deactivate the preamplifier 302 upon the second input voltage exceeding the first input voltage and further configured to activate the preamplifier 302 upon a fall of the second input voltage. The switching signal provided to the switch circuit arrangement 304 to deactivate or activate the preamplifier 302 may be denoted as $SW_1$. The comparator circuit arrangement 200 may further include a pull-up circuit arrangement 306 coupled to the output of the preamplifier 302, the pull-up circuit arrangement 306 configured to provide a boost voltage to the preamplifier output signal for a predetermined duration upon the fall of the second input voltage.

The comparator circuit arrangement 300 may include a first inverter 308a having an input connected to the output of the preamplifier 302, and an output. The comparator circuit arrangement 300 may also include a second inverter 308b having an input connected to the output of the first inverter 308a, and an output configured to generate the output of the comparator circuit arrangement ($V_{PWM}$).

The comparator circuit arrangement 300 may utilize a low-power technique (i.e. to lower the power consumption) as well as a high-speed recovery technique. As the ramp voltage $V_{RAMP}$ increases from a low voltage ($V_{low}$) to point A, the comparator circuit arrangement 300 may behave in a similar manner as a conventional comparator. However, as the comparator circuit arrangement 300 may not be required to be active after point A is sensed or detected, the comparator circuit arrangement 300 may be configured to be switched off until point B. The operating biasing current provided to the input supply port of the preamplifier 302 may be switched off by switch circuit arrangement 304. From point B, the preamplifier 302 may again be provided with the operating biasing current as $V_{RAMP}$ increases. The preamplifier 302 may not need to be active for sensing the exact crossing point of two inputs at the time of B but should be ready for searching the input level after the time point B. By cutting off the preamplifier operating current from A to B, the total current consumption and therefore power consumption may be reduced.

FIG. 3B shows a detailed schematic of the comparator circuit arrangement 300 according to various embodiments. Not all elements in FIG. 3B have been labelled to avoid clutter and improve clarity. These elements will be labelled in the subsequent FIGS.

As shown in FIG. 3B, the switch circuit arrangement 304 (denoted by dashed line boundary) may include a D flip-flop 310 and a current mirror 312 coupled or connected to the D flip-flop 312. The switch circuit arrangement 304 may further include a reset circuit arrangement 314 with the input coupled or connected to the second input of the preamplifier 302. The output of the reset circuit arrangement 314 may be coupled or connected to the D flip-flop 310 and the pull-up circuit arrangement 306.

Figure 3D:
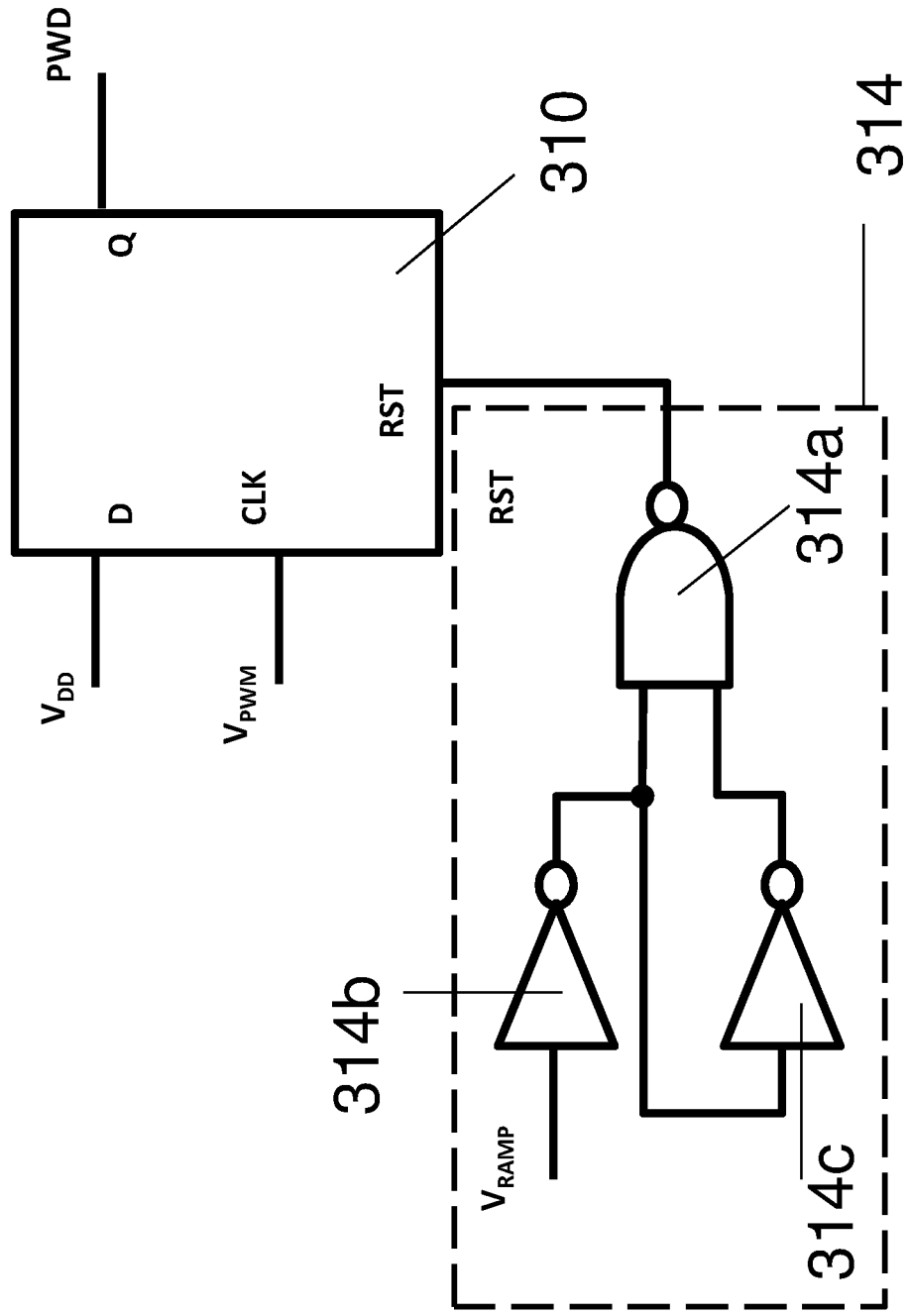
FIG. 3D is a schematic showing the reset circuit arrangement and the D flip-flop according to various embodiments.

FIG. 3C shows a detailed timing diagram of various signals provided to or generated by the comparator circuit arrangement 300 according to various embodiments. FIG. 3D is a schematic showing the reset circuit arrangement 314 and the D flip-flop 310 according to various embodiments.

When the comparator circuit arrangement senses the crossing point A, the output ($V_{PWM}$) may change from state "high" to state "low" (see timing diagram in FIG. 3A). The complementary signal ($\overline{V_{PWM}}$) may be used for the clock signal of the D flip-flop 310 whose input (D) is fixed to $V_{DD}$ (logic-high). By doing so, the power down (PWD) signal from output (Q) may accordingly change from logic state "low" to logic state "high" in the first CLK rising edge (see FIG. 3C). After the PWD signal becomes "high", the preamplifier 302 may be deactivated or switched off. The D flip-flop 310 may need to be reset at the point B to make the PWD signal "low". Since the $V_{RAMP}$ drops with a large voltage swing at the point B, a few logic gates (NOT gates and NAND gates) may be enough to create a shot-pulse in the reset signal (RST). After the PWD signal gets "low", the preamplifier 302 may again be activated or powered on to start searching input level again (using $V_{RAMP}$).

In other words, the D flip-flop 310 may include an input (D) configured to be coupled to a fixed reference voltage source ($V_{DD}$). The D flip-flop 310 may also include a clock input (CLK) configured to be coupled to a variable signal ($\overline{V_{PWM}}$) which is complementary or inverted to an output of the comparator circuit arrangement ($V_{PW}$). The D flip-flop 310 may also include a reset input (RST) configured to receive the reset signal (RST) so that the reset pulse (i.e. the shot-pulse) resets the D flip-flop 310 upon the fall of the second input voltage $V_{RAMP}$. The D flip-flip 310 may also include an output (Q) configured to generate a power down signal (PWD) based on the fixed voltage (VDD), the variable signal ($\overline{V_{PWM}}$), and the reset signal (RST).

The reset circuit arrangement 314 may be configured to provide the reset signal (RST) to the switch circuit arrangement 304, i.e. the flip flop 310, so that the switch circuit arrangement 304, i.e. the current mirror 312, is configured to activate the preamplifier 302. The reset circuit arrangement 314 may include a NAND gate 314a having a first input, a second input, and an output. The reset circuit arrangement 314 may also include a first NOT gate 314b having an input configured to receiving the second input voltage, and an output connected to the first input of the NAND gate 314a. The reset circuit arrangement 314 may further include a second NOT gate 314c having an input connected to the output of the first NOT gate 314b, and an output connected to the second input of the NAND gate 314a. The reset circuit arrangement 314 may be configured so that the output of the NAND gate 314a is configured to generate the reset signal upon the fall of the second input voltage.

As $V_{RAMP}$ drops at point B, the output of NOT gate 314b may be at "high" while the output of NOT gate 314c may also still remain at "high" for a predetermined period of time. In other words, there may be a delay before the output of NOT gate 314c switches from "high" to "low". The "high" state present in both NOT gates 314b and 314c may result in the generation of the reset pulse at the output of the NAND gate 314a.

As such, resettable D flip-flop 310 may cooperate together with logic gates 314a-c to generate the PWD signal.

Figure 3E:
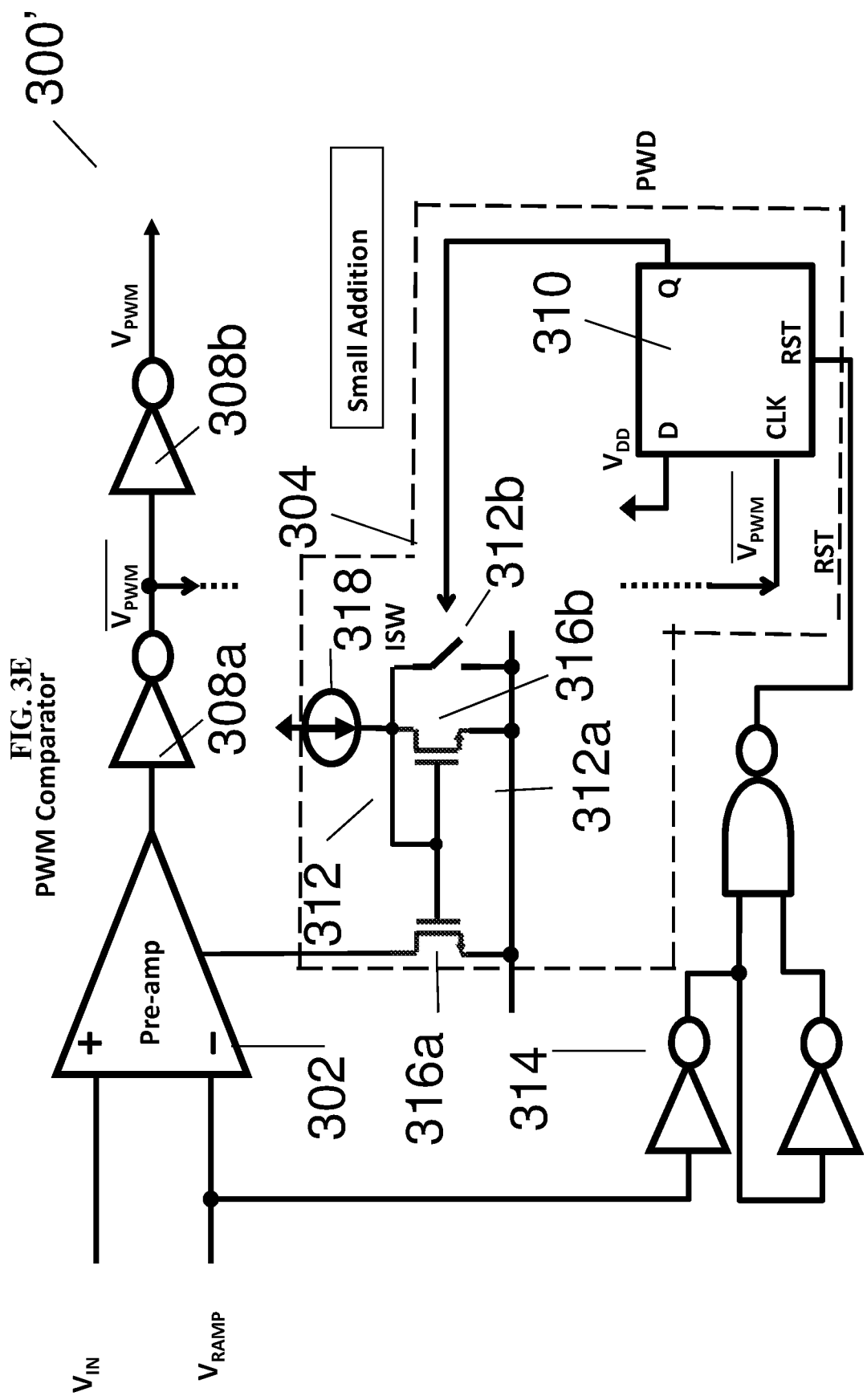
FIG. 3E shows the part of the comparator circuit arrangement according to various embodiments associated with reducing power consumption.

FIG. 3E shows the part of the comparator circuit arrangement 300' according to various embodiments associated with reducing power consumption. The current mirror circuit arrangement 312 may be connected to the preamplifier 302. The current mirror circuit arrangement 312 may also be connected to the flip flop 310, i.e. the output (Q) of the flip flop 310. The current mirror circuit arrangement 312 may include a current mirror 312a and a current mirror switch 312b (ISW). The current mirror arrangement 312 may also include a current source 318 connected to the current mirror 312a. The current mirror switch 312b may be configured to deactivate the current mirror 312a when the power down signal (PWD) is at the first state ("power off" state or "power down" state), thereby deactivating the preamplifier 302. The current mirror switch 312b may be further configured to activate the current mirror 312a when the power down signal (PWD) is at the second state (("power on" state or "power up" state), thereby activating the preamplifier 302.

The current mirror 312a may include a first transistor 316a (e.g. a n-channel metal oxide field effect transistor or nMOS) including a control electrode, a first controlled electrode and a second controlled electrode. The current mirror may also include a second transistor 316b (e.g. a n-channel metal oxide field effect transistor or nMOS) including a control electrode, a first controlled electrode and a second controlled electrode. The control electrodes of the two transistors 316a,b may be connected together. The second controlled electrodes of the two transistors 316a,b may be connected to ground. The first controlled electrode of the first transistor 316a may be connected to preamplifier 302, while the first controlled electrode of the second transistor 316b may be connected to the current source 318. The current mirror switch 312b may have one end connected to the control electrodes of the two transistors 316a,b and another end connected to ground. The state of the current mirror switch 312b may be controlled by the PWD signal.

When the power down signal (PWD) is at the first state ("power off" state or "power down" state), the current mirror switch 312b may be in the "closed state" (i.e. connected) and the control electrodes of the two transistors 316a,b may be at ground, thus deactivating the current mirror 312a. The current mirror switch 312 may thus prevent reference current from the current source 318 from flowing into the current mirror 312a, so that biasing operating current may be stopped from flowing to the preamplifier 302. When the power down signal (PWD) is at the second state ("power on" state or "power up" state), the current mirror switch 312b may be in the "open" state (i.e. disconnected) and the control electrodes of the two transistors 316a,b may be at a predetermined positive voltage, thus activating the current mirror 312a and allowing the biasing operating current to flow to the preamplifier 302.

Figure 3F:
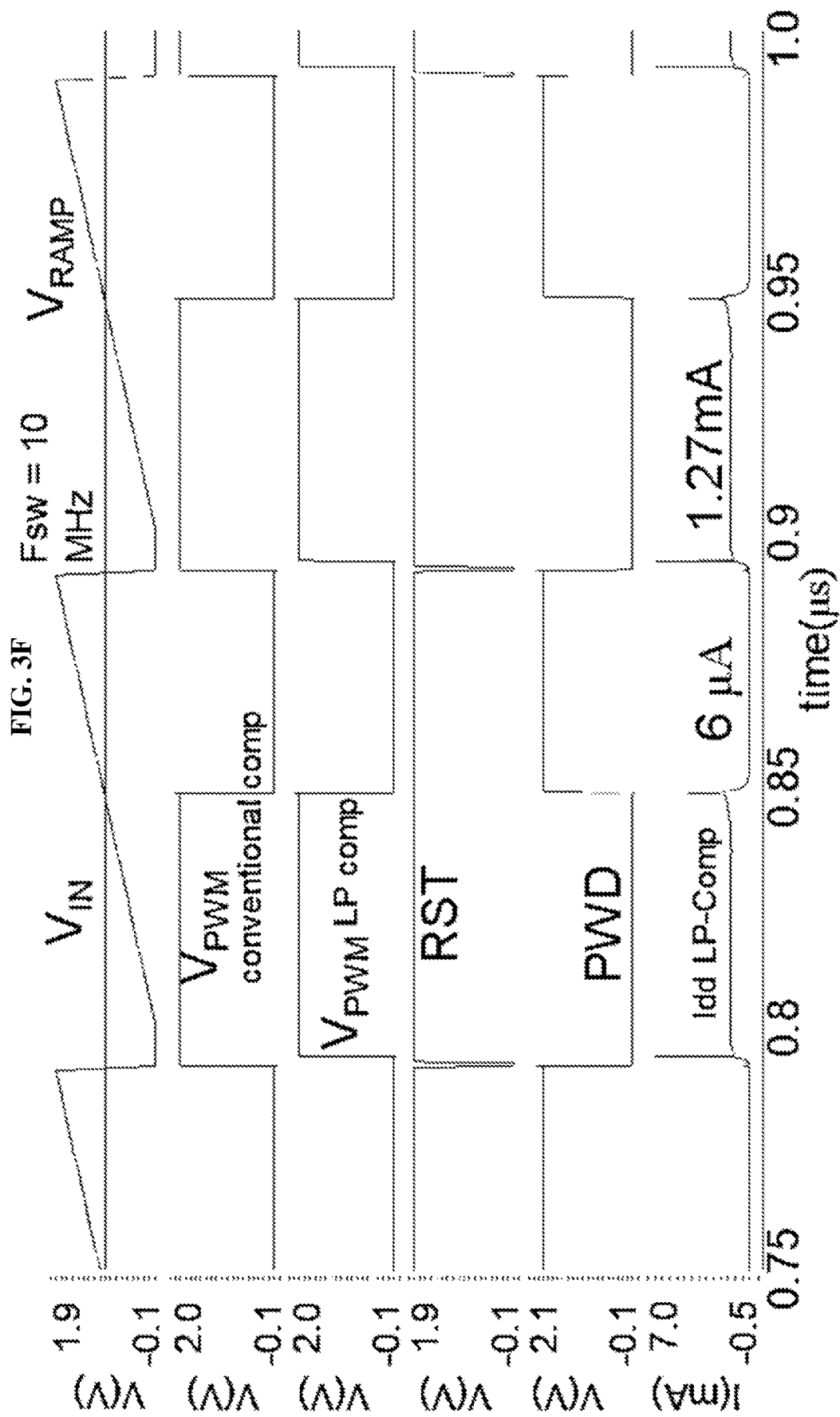
FIG. 3F shows the timing diagrams of an output signal of a conventional comparator ($V_{PWM}$ conventional comp) as well as the various signals provided to or generated by the low-power (LP) comparator circuit arrangement according to various embodiments.

FIG. 3F shows the timing diagrams of an output signal of a conventional comparator ($V_{PWM}$ conventional comp) as well as the various signals provided to or generated by the low-power (LP) comparator circuit arrangement 300' according to various embodiments. FIG. 3F shows that the power down signal (PWD) gets "high" when the second input signal $V_{RAMP}$ exceeds the first input signal $V_{IN}$, and that the power down signal (PWD) is maintained at "high" until the second input signal $V_{RAMP}$ drops to "low". The output of the low-power comparator circuit arrangement 300' may follow the power down signal (PWD), and the reset signal (RST) may be asserted as the power down signal (PWD) becomes "low".

The current in the low-power comparator circuit arrangement 300' (Idd LP-Comp) may be at about 1.27 mA when the power down signal (PWD) signal is "low", and may be at about 6 µA when the power down signal (PWD) signal is "high". The average current of the low-power comparator circuit arrangement 300' may be 671 µA while the average current of the conventional comparator may be about 1.444 mA from the simulations. Various embodiments may thus reduce the total power consumption.

By powering off the preamplifier 302 when the comparator circuit arrangement 300' senses the second input voltage exceeding the first input voltage, the comparator circuit arrangement may suffer from a long recovery time before the preamplifier 302 is powered on again.

Figure 3G:
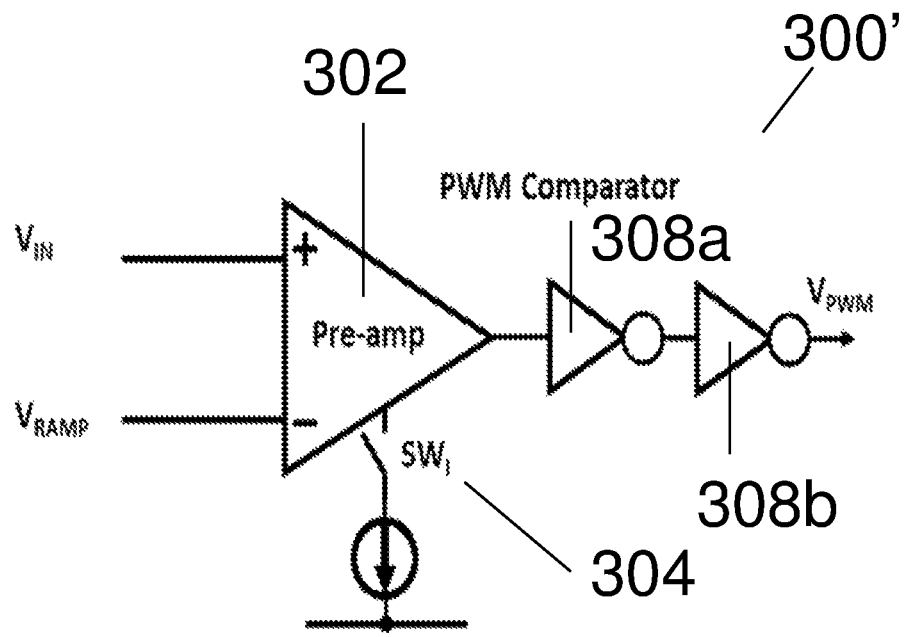
FIG. 3G shows a schematic of the comparator circuit arrangement according to various embodiments without the pull-up circuit arrangement as well as the timing diagram of the various signals provided to or generated by the comparator circuit arrangement.
Figure 3G:
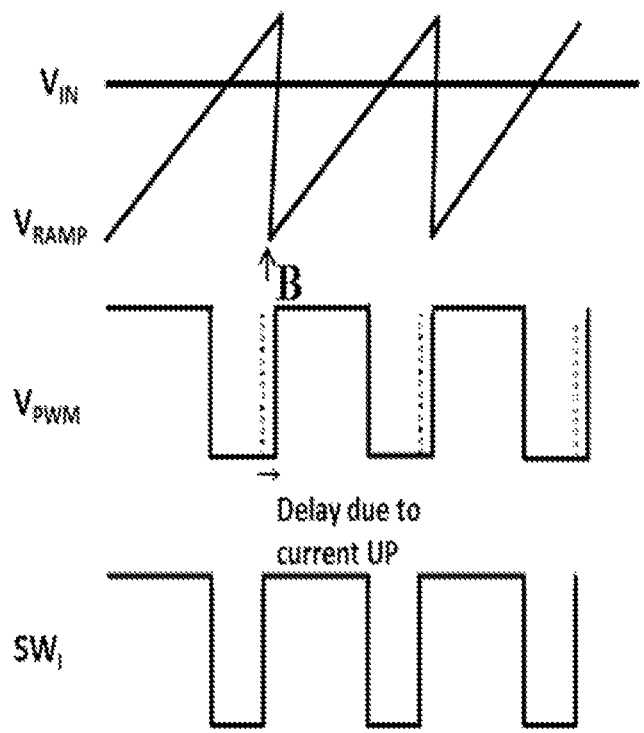

FIG. 3G shows a schematic of the comparator circuit arrangement 300' according to various embodiments without the pull-up circuit arrangement 306 as well as the timing diagram of the various signals provided to or generated by the comparator circuit arrangement 300'. FIG. 3G shows that when the switch circuit arrangement 304 is activated to provide biasing operating current to the preamplifier 302, there may be a delay before the output of the comparator circuit arrangement 300' ($V_{PWM}$) responds to the activation of the switch circuit arrangement 304. As a result of this long "wake up" time, the comparator circuit arrangement 300' may be unable to operate at a high switching frequency.

Various embodiments may include the pull-up circuit arrangement 306 to address the slow recovery time.

Figure 3H:
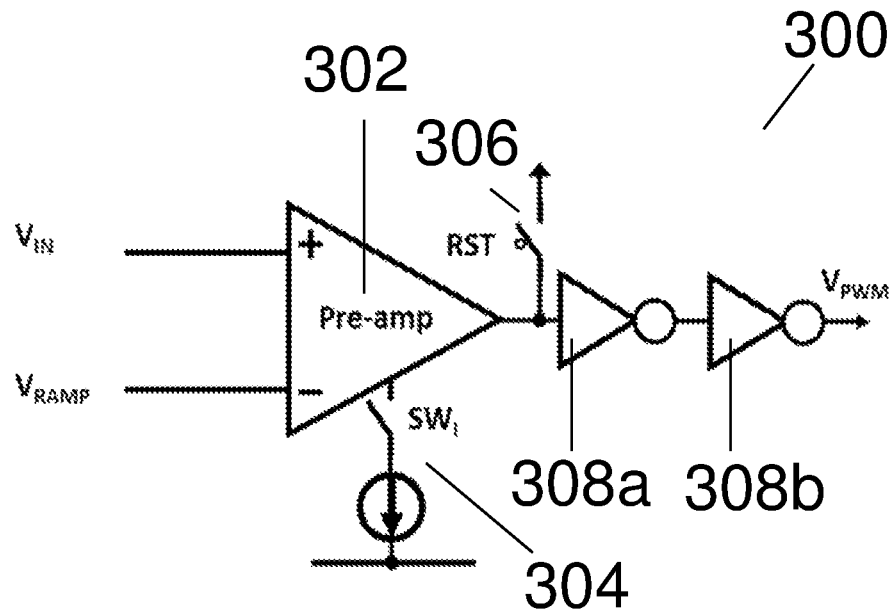
FIG. 3H shows a schematic of the comparator circuit arrangement according to various embodiments as well as the timing diagram of the various signals provided to or generated by the comparator circuit arrangement to illustrate how the pull-up circuit arrangement improves the recovery time.
Figure 3H:
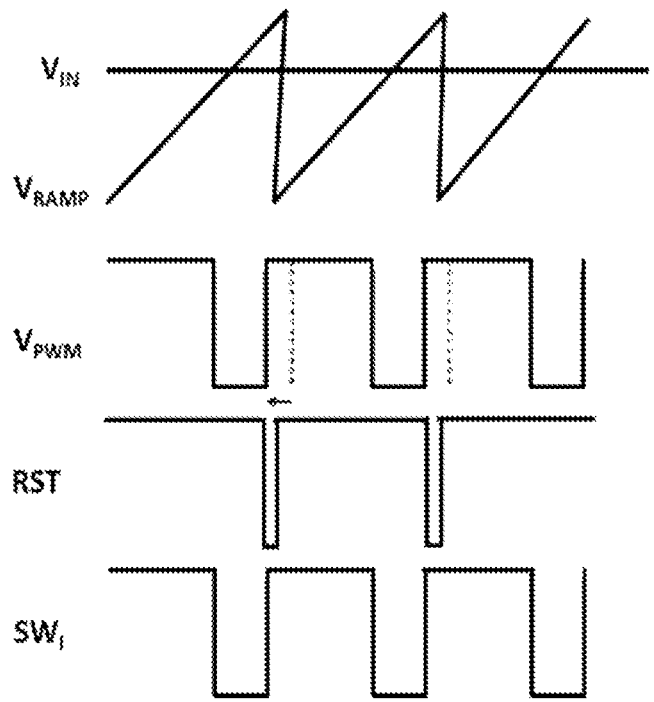

FIG. 3H shows a schematic of the comparator circuit arrangement 300 according to various embodiments as well as the timing diagram of the various signals provided to or generated by the comparator circuit arrangement 300 to illustrate how the pull-up circuit arrangement 306 improves the recovery time.

By providing a boost voltage to the preamplifier output signal for a predetermined duration (e.g. less than 1 ns or less than 0.5 ns) upon the fall of the second input voltage, the output of the comparator circuit arrangement ($V_{PWM}$) may be pulled up as the preamplifier 302 is powering up. In other words, the comparator circuit arrangement 300 may be pulled up faster than comparator circuit arrangement 300'.

Without the pull-up circuit arrangement 306, the comparator circuit arrangement 300' may have to wait for the preamplifier 302 to gradually be in the full state after the switch circuit arrangement 304 is activated before $V_{PWM}$ goes high, thereby causing delay. The pull-up circuit arrangement 306 may help to pull up the output of the comparator circuit arrangement ($V_{PWM}$) when the preamplifier 302 is in the midst of recovering to the full state.

The pull-up circuit arrangement 306 may also be referred to as a reset switch (RST switch).

Figure 3I:
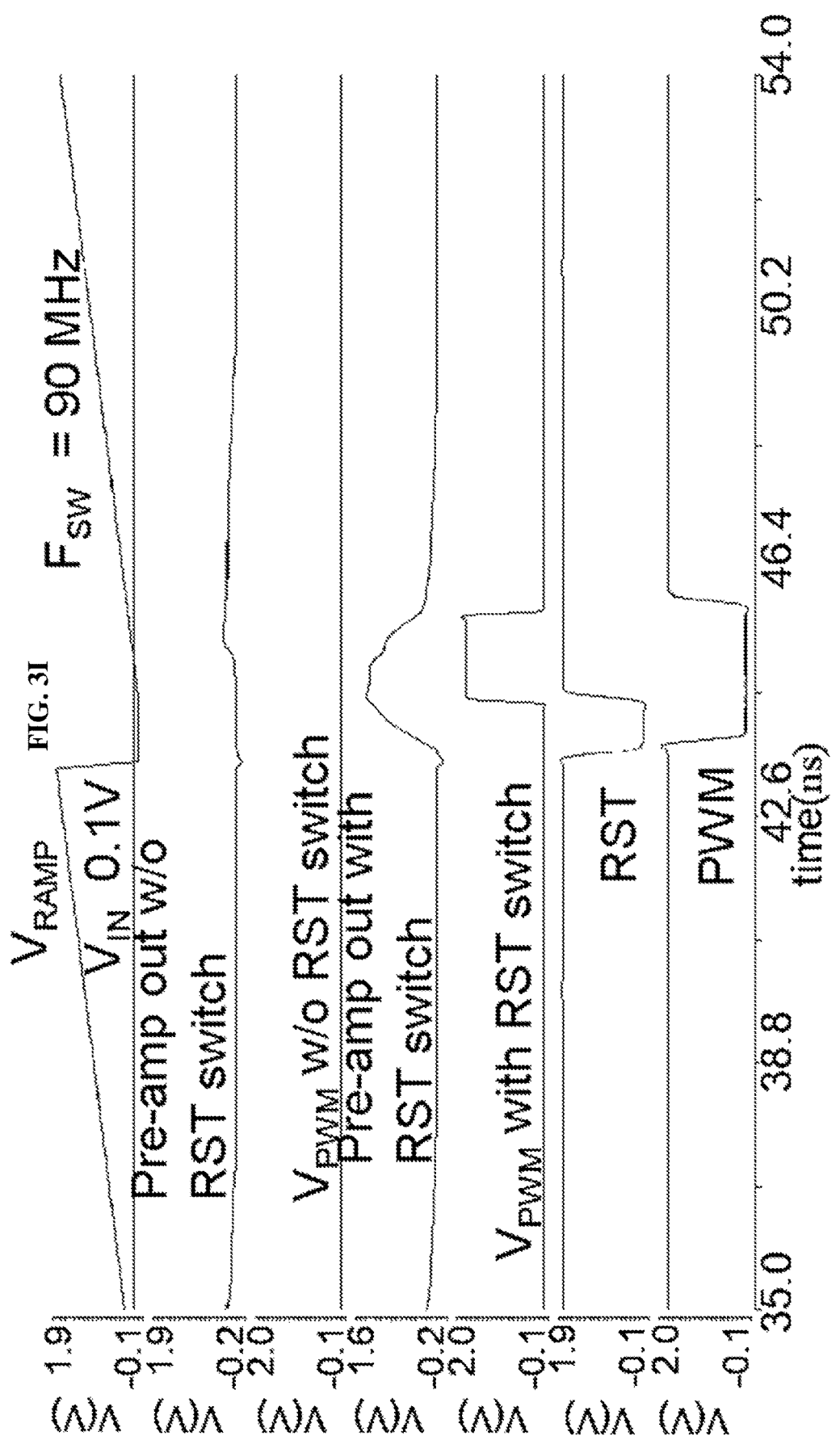
FIG. 3I is a detailed timing diagram of the comparator circuit arrangements according to various embodiments (switching frequency ($F_{sw}$) is 90 MHz and first input voltage is 0.1 V) illustrating the effects with and without the pull up circuit arrangement.

FIG. 3I is a detailed timing diagram of the comparator circuit arrangements 300, 300' according to various embodiments (switching frequency ($F_{sw}$) is 90 MHz and first input voltage is 0.1 V) illustrating the effects with and without the pull up circuit arrangement 306. As shown in FIG. 3I, the output of the preamplifier 302 of the arrangement 300' without the reset switch 306 (Pre-amp out w/o RST switch) may increase slightly in response to the low first input voltage of 0.1 V and the second input voltage (i.e. ramping voltage) after the preamplifier 302 is activated by the biasing operating current. However, as the first input voltage crosses with the second input voltage (i.e. ramping voltage), the output of the preamplifier 302 of the arrangement 300' may be reduced, resulting in a relatively flat output ($V_{PWM}$ w/o RST switch).

On the other hand, for the comparator circuit arrangement 300 including the reset switch 306, the preamplifier output (Pre-amp with RST switch) may increase to about 1.4 V with the help of the pull-up switching arrangement 306. The output of the comparator circuit arrangement 300 ($V_{PWM}$ with RST switch) may become "high" before switching to "low" as the input voltages $V_{IN}$ $V_{RAMP}$ cross. FIG. 3I also shows the reset signal (RST) and the power down signal (PWD).

Figure 3J:
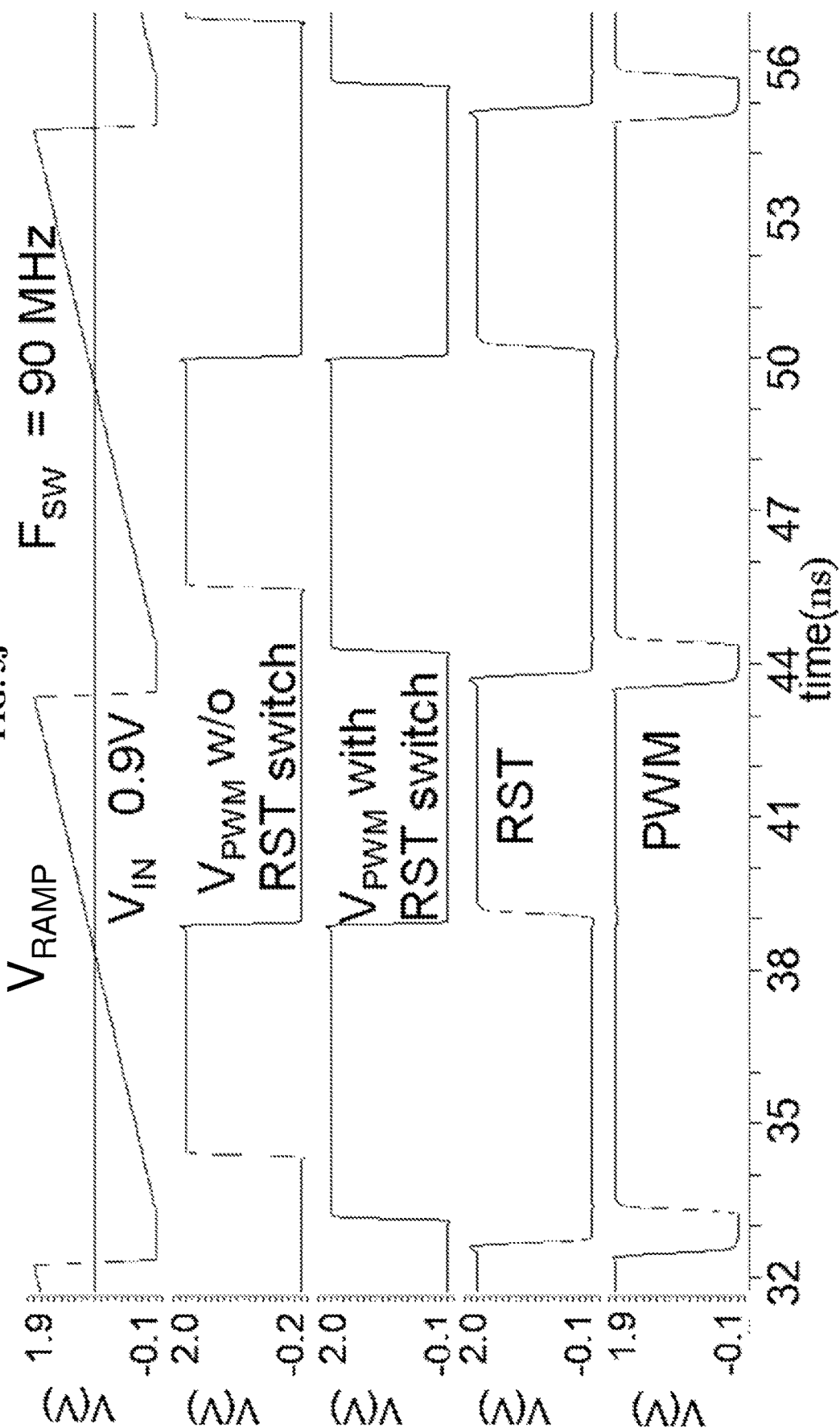
FIG. 3J is another detailed timing diagram of the comparator circuit arrangements according to various embodiments (switching frequency ($F_{sw}$) is 90 MHz and first input voltage is 0.9 V) illustrating the effects with and without the pull up circuit arrangement.

FIG. 3J is another detailed timing diagram of the comparator circuit arrangements 300, 300' according to various embodiments (switching frequency ($F_{sw}$) is 90 MHz and first input voltage is 0.9 V) illustrating the effects with and without the pull up circuit arrangement 306.

For the comparator 300' without the pull-up circuit arrangement 306, the comparator output ($V_{PWM}$ w/o RST switch) may become high only a while after $V_{RAMP}$ drops and subsequently increases. On the other hand, for the comparator 300 with the pull-up circuit arrangement 306, the comparator output ($V_{PWM}$ with RST switch) may become high shortly after drop of $V_{RAMP}$. FIG. 3J also shows the reset signal (RST) and the power down signal (PWD).

As shown above, the comparator 300' without the pull-up circuit arrangement 306 may be unable to respond to low first input voltages ($V_{IN}$). The average current of the comparator 300 with the pull-up circuit arrangement 306 may be about 881 μA, while the average current of the comparator 300' without the pull-up circuit arrangement 306 may be slightly lower at about 824 μA. The conventional comparator may consume an average current of about 1.519 mA based on simulations.

Figure 3K:
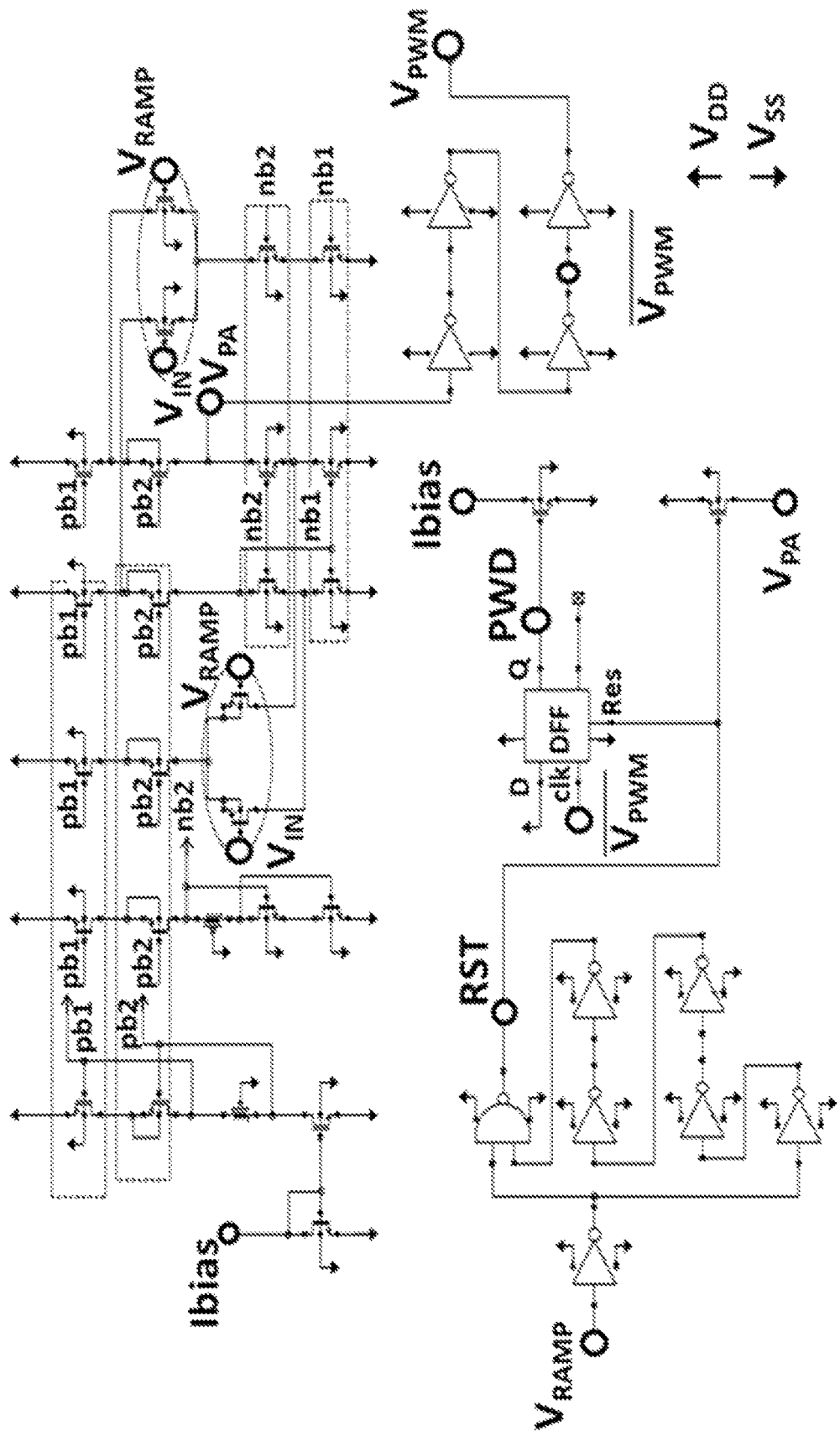
FIG. 3K shows an implementation of the comparator circuit arrangement according to various embodiments.

FIG. 3K shows an implementation of the comparator circuit arrangement 300 according to various embodiments.

Figure 3L:
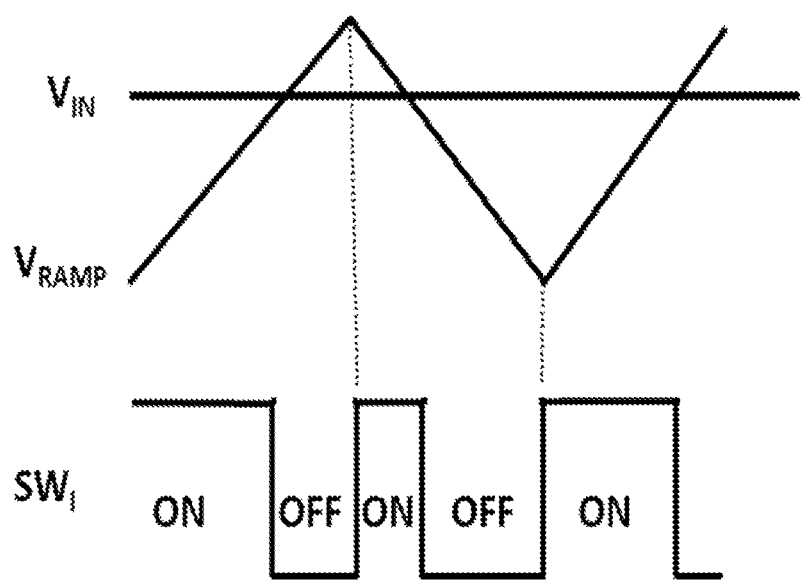
FIG. 3L shows alternative input voltages as well as the switching signal associated with the comparator circuit arrangement according to various embodiments.

FIG. 3L shows alternative input voltages as well as the switching signal associated with the comparator circuit arrangement 300 according to various embodiments. In various embodiments, the second input voltage may have a triangle waveform. The triangle waveform may have a first part that increases from a first predetermined value below a value of the first input voltage to a second predetermined value above the value of the first input voltage within a first predetermined period of time, and a second part that decreases from the second predetermined value to the first predetermined value within a second predetermined period of time substantially equal to the first predetermined period of time.

For second input voltage having the triangle waveform, the power consumption may be reduced by almost 50%, no matter what the first input voltage level is.

Various embodiments may provide a power efficient gated PWM comparator circuit arrangement which reduces the power consumption by switching off the operating current after ramp signal reaches a predetermined input level. The comparator circuit arrangement may also employ a pull-up circuit arrangement connected to the preamplifier together with the switch circuit arrangement, so that the comparator circuit arrangement is capable to operate at a high switching frequency under low power consumption. The circuit simulation may prove the effectiveness of the pull-up circuit arrangement in the PWM comparator circuit arrangement when it operates at 90 MHz switching frequency. The circuit simulation may also show that the average current of the low-power high-speed comparator is about 881 μA while the conventional comparator consumes about 1.519 mA.

Figure 4:
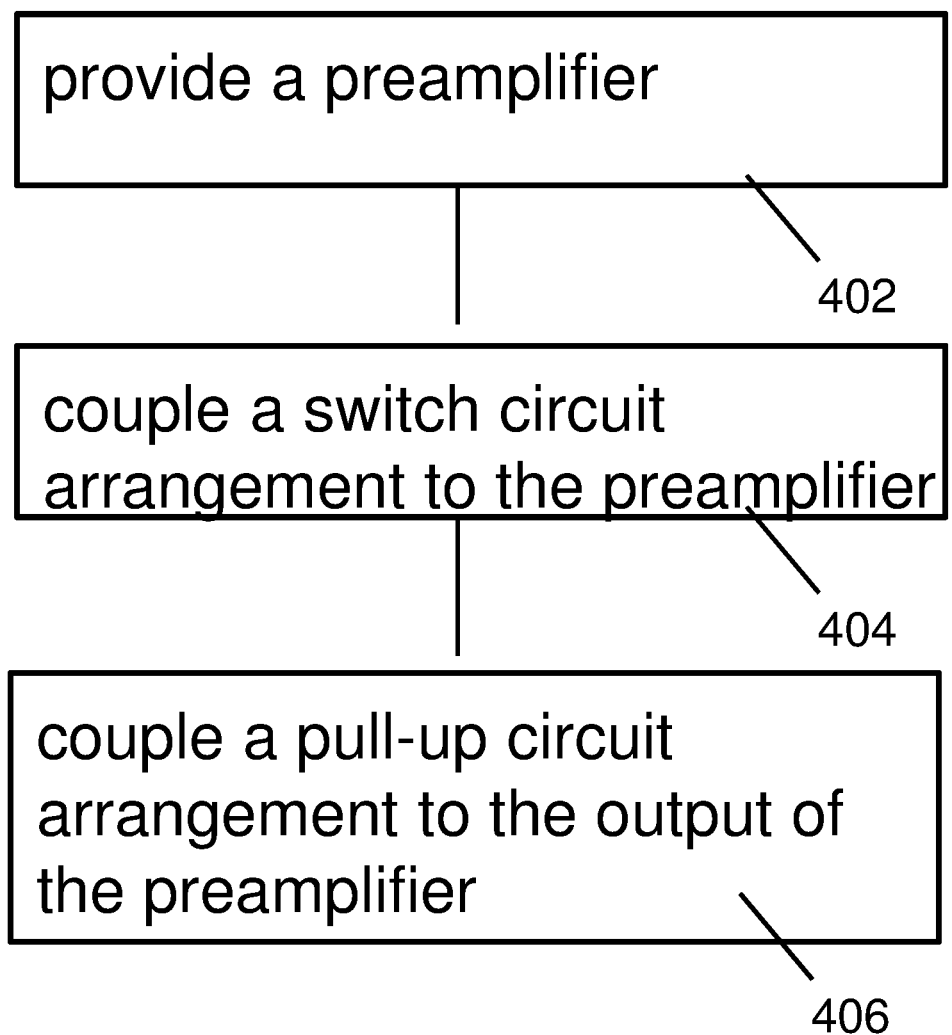
FIG. 4 shows a schematic of a method of forming a comparator circuit arrangement according to various embodiments.

FIG. 4 shows a schematic of a method of forming a comparator circuit arrangement according to various embodiments. The method may include, in 402, providing a preamplifier having a first input configured to be coupled to a first input voltage, a second input configured to be coupled to a second input voltage, and an output configured to generate a preamplifier output signal based on the first input voltage and the second input voltage. The method may also include, in 404, coupling a switch circuit arrangement to the preamplifier, the switch circuit arrangement configured to deactivate the preamplifier upon the second input voltage exceeding the first input voltage and further configured to activate the preamplifier upon a fall of the second input voltage. The method may further include, in 406, coupling a pull-up circuit arrangement to the output of the preamplifier, the pull-up circuit arrangement configured to provide a boost voltage to the preamplifier output signal for a predetermined duration upon the fall of the second input voltage.

In other words, the method may include coupling both the switch circuit arrangement and the pull-up circuit arrangement to the preamplifier.

In various embodiments, the method may include connecting an input of a first inverter to the output of the preamplifier.

The method may also include also include connecting an input of a second inverter to an output of the first inverter. An output of the second inverter may be configured to generate the output of the comparator circuit arrangement.

In various embodiments, the switch circuit arrangement may include a reset circuit arrangement coupled to the second input of the preamplifier. The reset circuit arrangement is configured to provide or generate a reset signal upon the fall of the second input voltage.

In various embodiments, the switch circuit arrangement may include a D flip-flop. The output of the NAND gate may be connected to the D flip-flop, i.e. the reset (RST) input or port of the D flip-flop.

In various embodiments, the switch circuit arrangement may further include a current mirror circuit arrangement coupled to the D flip-flop. The reset pulse (generated by the reset circuit arrangement) may be provided to the D flip-flop so that the D flip-flop, upon receiving the reset pulse, controls the current mirror circuit arrangement to activate the preamplifier.

In various embodiments, the D flip-flop may include an input or port (D) configured to be coupled to a fixed reference voltage source. The fixed reference voltage source may provide a voltage $V_{DD}$, which may correspond to a "high" state or digital logic "1" state.

In various embodiments, the D flip-flop may further include a clock input or port (CLK) configured to be coupled to a variable signal based on the second input voltage and the first input voltage received by the preamplifier. The variable signal may be complementary or inverted to an output of the comparator circuit arrangement.

The output of the comparator circuit arrangement may be generated based on the output of the preamplifier and the boost voltage.

In various embodiments, the D flip-flop may also include a reset input or port configured to receive the reset signal so that the reset pulse resets the D flip-flop, i.e. upon the fall of the second input voltage. The D flip-flip may also include an output configured to generate a power down signal based on the fixed voltage, the variable signal, and the reset signal.

The power down signal may be at a first state (may be referred to as "power off" state or "power down" state) upon the second input voltage exceeding the first input voltage. The power down signal may be at a second state (may be referred to as "power on" state or "power up" state) upon the fall of the second input voltage.

In various embodiments, the switch circuit arrangement may further include a current mirror circuit arrangement coupled to the D flip-flop.

The current mirror circuit arrangement may be connected to the preamplifier, e.g. the power input of the preamplifier. The preamplifier may be configured to be deactivated when the power down signal is at the first state ("power off" state or "power down" state). Conversely, the preamplifier may be configured to be activated when the power down signal is at the second state ("power on" state or "power up" state).

The current mirror circuit arrangement may include a current mirror and a current mirror switch. The current mirror switch may be configured to receive the power down signal. The current mirror switch may be configured to control the current mirror, i.e. configured to activate or deactivate the current mirror, based on a state of the power down signal. The current mirror switch may be configured to deactivate the current mirror when the power down signal is at the first state ("power off" state or "power down" state), thereby deactivating the preamplifier. The current mirror switch may be further configured to activate the current mirror when the power down signal is at the second state ("power on" state or "power up" state), thereby activating the preamplifier.

In various embodiments, the pull-up circuit arrangement may be configured to receive the reset signal and may be further configured to provide the boost voltage to the preamplifier output signal (for the predetermined duration) upon receiving the reset pulse.

In various embodiments, the pull-up circuit arrangement may include a fixed boost voltage source configured to provide the boost voltage. The boost voltage may be the voltage $V_{DD}$. In various embodiments, the boost voltage may be or may be not equal to the voltage provided by the fixed reference voltage source to the D flip-flop.

In various embodiments, the pull-up circuit arrangement may include a pull-up switch. The pull-up switch may be configured to connect the output of the preamplifier to the fixed boost voltage source upon receiving the reset pulse, thereby provide the boost voltage to the preamplifier output signal for the predetermined duration.

Figure 5:
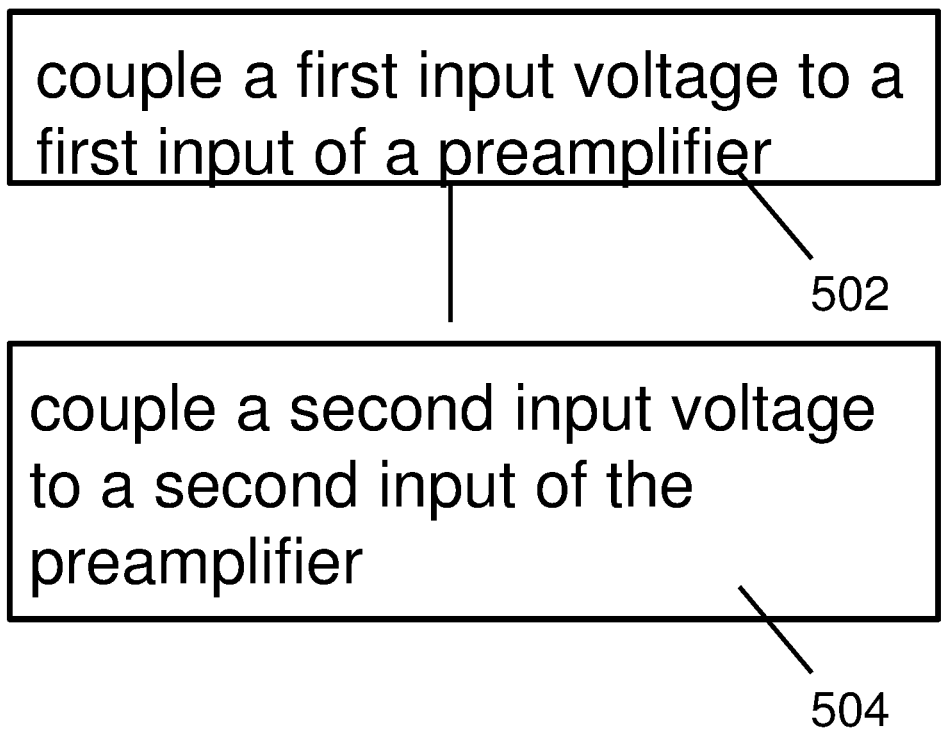
FIG. 5 shows a schematic of a method of operating a comparator circuit arrangement according to various embodiments.

FIG. 5 shows a schematic of a method of operating a comparator circuit arrangement according to various embodiments. The method may include, in 502, coupling a first input voltage to a first input of a preamplifier. The method may also include, in 504, coupling a second input voltage to a second input of the preamplifier. The preamplifier may also include an output configured to generate a preamplifier output signal based on the first input voltage and the second input voltage. The comparator circuit arrangement may further include a switch circuit arrangement coupled to the preamplifier, the switch circuit arrangement configured to deactivate the preamplifier upon the second input voltage exceeding the first input voltage and further configured to activate the preamplifier upon a fall of the second input voltage. The comparator circuit arrangement may additionally include a pull-up circuit arrangement coupled to the output of the preamplifier, the pull-up circuit arrangement configured to provide a boost voltage to the preamplifier output signal for a predetermined duration upon the fall of the second input voltage.

In other words, the method may include coupling the first input voltage to the first input of the preamplifier and coupling the second input voltage to the second input of the preamplifier.

The first input voltage may be a fixed voltage or a variable voltage.

In various embodiments, the first input voltage may have a first waveform. The second input voltage may have a second waveform including a first part that increases from a first predetermined value below a value of the first input voltage to a second predetermined value above the value of the first input voltage within a first predetermined period of time, and a second part that decreases from the second predetermined value to the first predetermined value within a second predetermined period of time, the second predetermined period of time being shorter than the first predetermined period of time. In various embodiments, the first waveform may vary more slowly than the second waveform.

In various other embodiments, the second input voltage may have a triangle waveform. The triangle waveform may have a first part that increases from a first predetermined value below a value of the first input voltage to a second predetermined value above the value of the first input voltage within a first predetermined period of time, and a second part that decreases from the second predetermined value to the first predetermined value within a second predetermined period of time substantially equal to the first predetermined period of time.

Various embodiments may relate to or include a current power-on/off scheme and implementation in the PWM comparator to reduce the power consumption. Various embodiments may relate to or include a quick output recovery switch in current power-on in the above PWM comparator to realize high speed switching operation.

A conventional PWM comparator draws the operating current in the preamplifier all time.

Various embodiments may relate to drawing a current in a function period and scheme implementation.

Various embodiments may relate to speeding up the recovery by a pull-up switch at the preamplifier output, and may help to compensate the lowering of the switching speed (due to long recovery time of the preamplifier) by current on/off scheme.

Various embodiments may have lower power consumption and higher switching speeds. Various embodiments may have improved efficiency.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A comparator circuit arrangement comprising:
a preamplifier having a first input configured to be coupled to a first input voltage, a second input configured to be coupled to a second input voltage, and an output configured to generate a preamplifier output signal based on the first input voltage and the second input voltage;
a switch circuit arrangement coupled to the preamplifier, the switch circuit arrangement configured to deactivate the preamplifier upon the second input voltage exceeding the first input voltage and further configured to activate the preamplifier upon a fall of the second input voltage; and
a pull-up circuit arrangement coupled to the output of the preamplifier, the pull-up circuit arrangement configured to provide a boost voltage to the preamplifier output signal for a predetermined duration upon the fall of the second input voltage;
wherein the switch circuit arrangement comprises a reset circuit arrangement coupled to the second input of the preamplifier; and
wherein the reset circuit arrangement is configured to generate a reset pulse in a reset signal upon the fall of the second input voltage.

2. The comparator circuit arrangement according to claim 1,
wherein the first input voltage has a first waveform;
wherein the second input voltage has a second waveform comprising:
a first part that increases from a first predetermined value below a value of the first input voltage to a second predetermined value above the value of the first input voltage within a first predetermined period of time;
a second part that decreases from the second predetermined value to the first predetermined value within a second predetermined period of time, the second predetermined period of time being shorter than the first predetermined period of time; and
wherein the first waveform varies more slowly than the second waveform.

3. The comparator circuit arrangement according to claim 1, wherein the reset circuit arrangement comprises:
a NAND gate having a first input, a second input, and an output;
a first NOT gate having an input configured to receiving the second input voltage, and an output connected to the first input of the NAND gate; and
a second NOT gate having an input connected to the output of the first NOT gate, and an output connected to the second input of the NAND gate.

4. The comparator circuit arrangement according to claim 3, wherein the reset circuit arrangement is configured so that the output of the NAND gate is configured to generate the reset pulse upon the fall of the second input voltage.

5. The comparator circuit arrangement according to claim 1, wherein the switch circuit arrangement comprises a D flip-flop.

6. The comparator circuit arrangement according to claim 5,
wherein the switch circuit arrangement further comprises a current mirror circuit arrangement coupled to the D flip-flop; and
wherein the reset pulse is provided to the D flip-flop so that the D flip-flop, upon receiving the reset pulse, controls the current mirror circuit arrangement to activate the preamplifier.

7. The comparator circuit arrangement according to claim 6,
wherein the D flip-flop comprises an input configured to be coupled to a fixed reference voltage source;
wherein the D flip-flop further comprises a clock input configured to be coupled to a variable signal based on the second input voltage and the first input voltage received by the preamplifier;
wherein the D flip-flop also comprises a reset input configured to receive the reset signal so that the reset pulse resets the D flip-flop; and
wherein the D flip-flip also comprises an output configured to generate a power down signal based on the fixed voltage, the variable signal, and the reset signal.

8. The comparator circuit arrangement according to claim 7,
wherein the variable signal is complementary or inverted to an output of the comparator circuit arrangement; and
wherein the output of the comparator circuit arrangement is generated based on the output of the preamplifier and the boost voltage.

9. The comparator circuit arrangement according to claim 8,
wherein the power down signal is at a first state upon the second input voltage exceeding the first input voltage; and
wherein the power down signal is at a second state upon the fall of the second input voltage.

10. The comparator circuit arrangement according to claim 8, further comprising:
a first inverter having an input connected to the output of the preamplifier, and an output;
a second inverter having an input connected to the output of the first inverter, and an output configured to generate the output of the comparator circuit arrangement.

11. The comparator circuit arrangement according to claim 6, wherein the current mirror circuit arrangement is connected to the preamplifier.

12. The comparator circuit arrangement according to claim 11,
wherein the preamplifier is configured to be deactivated when the power down signal is at the first state; and
wherein the preamplifier is configured to be activated when the power down signal is at the second state.

13. The comparator circuit arrangement according to claim 12,
wherein the current mirror circuit arrangement comprises a current mirror and a current mirror switch;
wherein the current mirror switch is configured to deactivate the current mirror when the power down signal is at the first state, thereby deactivating the preamplifier; and wherein the current mirror switch is further configured to activate the current mirror when the power down signal is at the second state, thereby activating the preamplifier.

14. The comparator circuit arrangement according to claim 1, wherein the pull-up circuit arrangement is configured to receive the reset signal and further configured to provide the boost voltage to the preamplifier output signal upon receiving the reset pulse.

15. The comparator circuit arrangement according to claim 14, wherein the pull-up circuit arrangement comprises a fixed boost voltage source configured to provide the boost voltage.

16. The comparator circuit arrangement according to claim 15,
wherein the pull-up circuit arrangement comprises a pull-up switch; and
wherein the pull-up switch is configured to connect the output of the preamplifier to the fixed boost voltage source upon receiving the reset pulse, thereby provide the boost voltage to the preamplifier output signal for the predetermined duration.

17. A method of forming a comparator circuit arrangement, the method comprising:
providing a preamplifier having a first input configured to be coupled to a first input voltage, a second input configured to be coupled to a second input voltage, and an output configured to generate a preamplifier output signal based on the first input voltage and the second input voltage;
coupling a switch circuit arrangement to the preamplifier, the switch circuit arrangement configured to deactivate the preamplifier upon the second input voltage exceeding the first input voltage and further configured to activate the preamplifier upon a fall of the second input voltage; and
coupling a pull-up circuit arrangement to the output of the preamplifier, the pull-up circuit arrangement configured to provide a boost voltage to the preamplifier output signal for a predetermined duration upon the fall of the second input voltage;
wherein the switch circuit arrangement comprises a reset circuit arrangement coupled to the second input of the preamplifier; and
wherein the reset circuit arrangement is configured to generate a reset pulse in a reset signal upon the fall of the second input voltage.

18. A method of operating a comparator circuit arrangement, the method comprising:
coupling a first input voltage to a first input of a preamplifier;
coupling a second input voltage to a second input of the preamplifier, the preamplifier further comprising an output configured to generate a preamplifier output signal based on the first input voltage and the second input voltage;
wherein the comparator circuit arrangement further comprises a switch circuit arrangement coupled to the preamplifier, the switch circuit arrangement configured to deactivate the preamplifier upon the second input voltage exceeding the first input voltage and further configured to activate the preamplifier upon a fall of the second input voltage; and
wherein the comparator circuit arrangement further comprises a pull-up circuit arrangement coupled to the output of the preamplifier, the pull-up circuit arrangement configured to provide a boost voltage to the preamplifier output signal for a predetermined duration upon the fall of the second input voltage;
wherein the switch circuit arrangement comprises a reset circuit arrangement coupled to the second input of the preamplifier; and
wherein the reset circuit arrangement is configured to generate a reset pulse in a reset signal upon the fall of the second input voltage.

19. The method according to claim 18,
wherein the first input voltage has a first waveform;
wherein the second input voltage has a second waveform comprising:
a first part that increases from a first predetermined value below a value of the first input voltage to a second predetermined value above the value of the first input voltage within a first predetermined period of time;
a second part that decreases from the second predetermined value to the first predetermined value within a second predetermined period of time, the second predetermined period of time being shorter than the first predetermined period of time; and
wherein the first waveform varies more slowly than the second waveform.

* * * * *